United States Patent
Chang et al.

(10) Patent No.: US 12,453,290 B2
(45) Date of Patent: Oct. 21, 2025

(54) MEMORY CELL, MEMORY DEVICE AND MANUFACTURING METHOD THEREOF

(71) Applicant: Taiwan Semiconductor Manufacturing Company, Ltd., Hsinchu (TW)

(72) Inventors: Kai-Tai Chang, Kaohsiung (TW); Chien-Min Lee, Hsinchu County (TW); Tung-Ying Lee, Hsinchu (TW); Shy-Jay Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 598 days.

(21) Appl. No.: 17/744,732

(22) Filed: May 16, 2022

(65) Prior Publication Data

US 2023/0371400 A1    Nov. 16, 2023

(51) Int. Cl.
*H10N 52/01*     (2023.01)
*H10B 61/00*     (2023.01)
*H10N 50/10*     (2023.01)
*H10N 52/80*     (2023.01)

(52) U.S. Cl.
CPC .......... *H10N 50/10* (2023.02); *H10B 61/00* (2023.02); *H10B 61/10* (2023.02); *H10B 61/22* (2023.02)

(58) Field of Classification Search
CPC ........ H10N 50/10; H10N 50/85; H10N 50/01; H10N 52/00; H10N 52/01; H10N 52/80; H10B 61/00; H10B 61/10; H10B 61/22
See application file for complete search history.

(56) References Cited

U.S. PATENT DOCUMENTS

| | | | | |
|---|---|---|---|---|
| 8,536,063 B2* | 9/2013 | Satoh | ...................... | H01L 29/00 438/738 |
| 9,830,966 B2* | 11/2017 | Mihajlovic | ............ | H10N 50/85 |
| 10,074,800 B2* | 9/2018 | Tahara | ................ | H01L 21/6833 |
| 10,096,649 B2* | 10/2018 | Park | ...................... | H10N 50/10 |
| 10,229,723 B1* | 3/2019 | Choi | ...................... | G11C 11/16 |
| 10,636,962 B2* | 4/2020 | Park | ...................... | H01F 10/3254 |
| 11,075,334 B2* | 7/2021 | Reznicek | ............... | H10N 50/01 |
| 11,174,431 B2* | 11/2021 | Ohishi | .................... | C09K 19/34 |
| 11,217,744 B2* | 1/2022 | Chern | .................... | H10B 61/22 |
| 11,251,362 B2* | 2/2022 | Wu | ......................... | H10N 52/00 |

(Continued)

*Primary Examiner* — Eduardo A Rodela
(74) *Attorney, Agent, or Firm* — JCIPRNET (57) ABSTRACT

A memory device and a method of manufacturing the same are provided. The memory device includes a semiconductor substrate, an interconnect structure and a memory cell. The interconnect structure is disposed over the semiconductor substrate, and the memory cell is disposed over the interconnect structure and electrically coupled with the semiconductor substrate and the interconnect structure. The memory cell includes a spin Hall electrode layer, an MTJ pillar, a hard mask, and a spacer. The MTJ pillar is disposed on the spin Hall electrode layer, the hard mask is disposed on the MTJ pillar, and the spacer is disposed on sidewalls of the MTJ pillar and the hard mask. Suitably, the spin Hall electrode layer at least comprises an inner portion and an outer portion surrounding the inner portion, and a top surface of the outer portion is lower than a top surface of the inner portion.

20 Claims, 10 Drawing Sheets

(56) References Cited

U.S. PATENT DOCUMENTS

2013/0015541 A1* 1/2013 Kanaya .................. H10N 50/01
257/E29.323
2023/0207045 A1* 6/2023 Chuang .................. G11C 29/42
714/718

* cited by examiner

MEMORY CELL, MEMORY DEVICE AND MANUFACTURING METHOD THEREOF

BACKGROUND

Memories may be categorized as volatile memories or non-volatile memories. Non-volatile memory keeps its contents even when the power is off. Volatile memory loses its contents when the power is off. Examples of next generation memory include resistive random-access memory (RRAM), phase-change random-access memory (PCRAM), or magneto-resistive random-access memory (MRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Magneto-resistive random-access memory (MRAM) offers comparable performance to volatile static random-access memory (SRAM) and comparable density with lower power consumption to volatile dynamic random-access memory (DRAM). In addition, the fabrication processes of MRAM are compatible with the existing complementary metal-oxide-semiconductor (CMOS) process. MRAM is a promising candidate for next generation embedded memory devices. One type of an MRAM is a spin transfer torque magnetic random access memory (STT-MRAM). A STT MRAM utilizes a magnetic tunneling junction (MTJ) written at least in part by a current driven through the MTJ. Another type of an MRAM is a spin orbit torque MRAM (SOT-MRAM), which generally requires a lower switching current than a STT-MRAM.

The embodiments of the present disclosure relate to memory devices, and specifically to a MRAM device with spin Hall electrode and methods of forming the same. Generally, the structures and methods of the present disclosure may be used as memory devices including a spin Hall electrode that is patterned to have varying thicknesses at different regions of respective memory device. A global etching process may be performed to pattern the spin Hall electrode, and the spin Hall electrode that is covered by an overlying MTJ structure and a spacer around the MTJ structure is protected from being etched during the global etching process. Thus, the spin Hall electrode may have thicker portion(s) or the thickest portion (with the largest thickness) at the central portion of the memory device and have thinner portion(s) or the thinnest portion (with the smallest thickness) at the peripheral portion(s) of the memory device. That is, the portion that is covered by the MTJ and the spacer is the thicker portion(s) or the thickest portion of the memory device. The thickness difference(s) of the spin Hall electrode can generate difference(s) in resistance at various portions within the spin Hall electrode, leading to increased current flowing from the periphery of the spin Hall electrode to the center of the spin Hall electrode and then flowing into the MTJ structure.

It is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using embodiments in which memory cells are located within a specific metal interconnect level, e.g., a first metal interconnect level, embodiments are expressly contemplated herein in which the memory cell may be formed within any of the metal interconnect levels.

Figure 1:
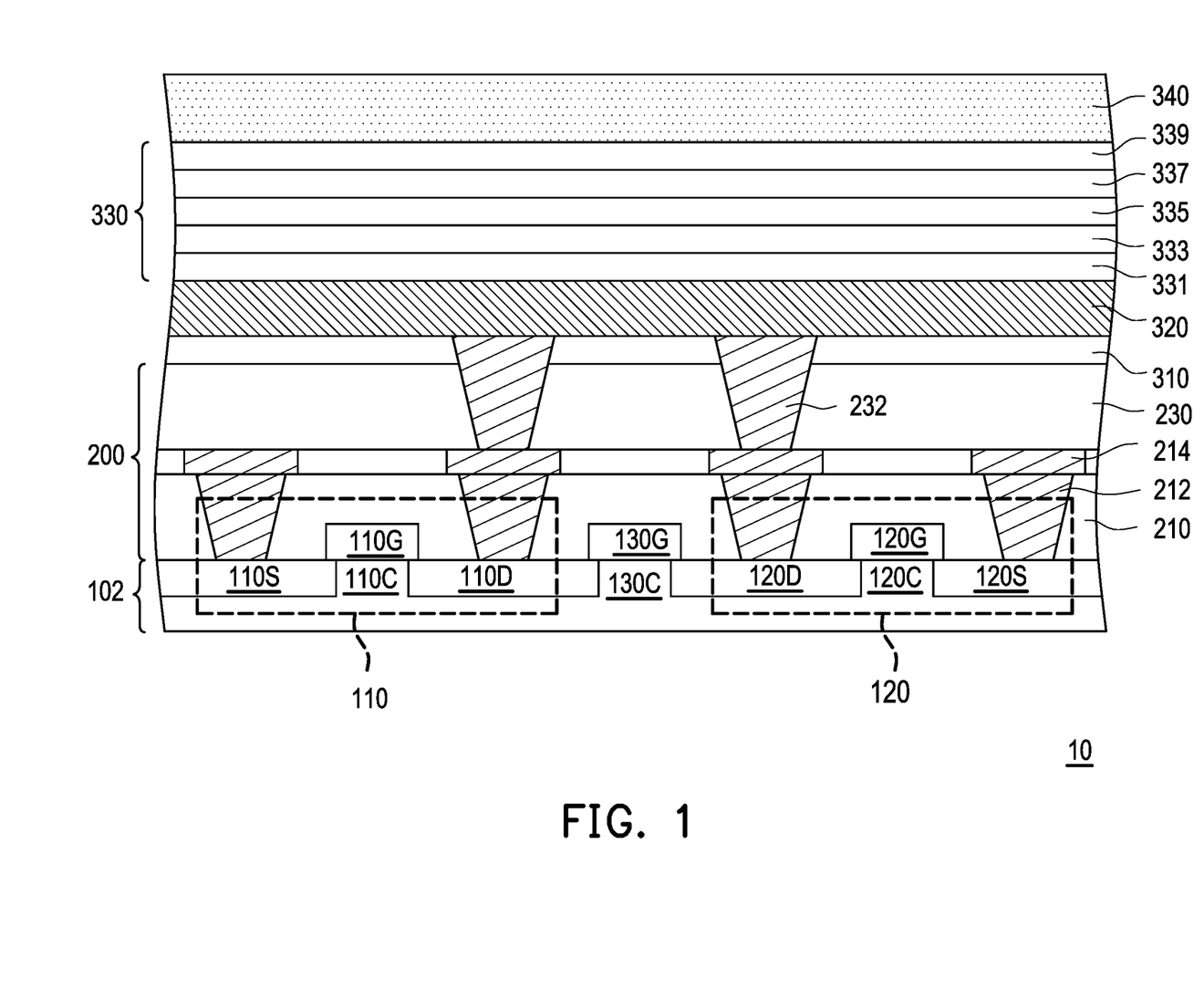
FIG. 1 through FIG. 6 are schematic cross-sectional views showing a portion of the structure at various stages of a manufacturing method of a memory device in accordance with some embodiments of the present disclosure.

FIG. 1 illustrates a portion of a stacked structure 10 at an early stage of a manufacturing method of a memory device in accordance with some embodiments of the present disclosure. In FIG. 1, in some embodiments, the stacked structure 10 includes a semiconductor substrate 102, and the semiconductor substrate 102 may include functional circuitry therein. For example, transistors 110 and 120 (e.g., two active devices) are formed on the semiconductor substrate 102. The semiconductor substrate 102 may be patterned to have microstructures such as fins, slabs, the like, formed thereon, according to the desired architecture for the transistors 110, 120. In some embodiment, the transistors 110, 120 respectively includes a pair of source and drain regions 110S/110D or 120S/120D embedded in the semiconductor substrate 102, and a gate structure 110G or 120G disposed between the corresponding pair of the source and drain regions on a portion of the semiconductor substrate 102 that functions as channel regions (for example, channel regions 110C and 120C). In some embodiments, the source and drain regions 110S/110D and 120S/120D are doped, for example with n-type dopants or p-type dopants. It should be noted that the disclosure does not limit the architecture of the transistors 110, 120. In other embodiments, the transistors 110, 120 may be planar field effect transistors, fin field effect transistors, gate all around transistors, or any other transistor architecture. Furthermore, different gate contact schemes, such as front-gate, back-gate, double-gate, staggered, etc., are contemplated within the scope of the present disclosure. Accordingly, the transistors 110, 120 may be formed using any suitable manufacturing process, such as gate-first processes or gate-last processes. Although in FIG. 1 only transistors 110, 120 are illustrated over the semiconductor substrate 102, other active devices (e.g., diodes or the like) and/or passive devices (e.g., capacitors, resistors, or the like) may also be formed as part of the functional circuit.

In some embodiments, in FIG. 1, a portion of semiconductor substrate 102 between the two transistors 110 and 120 acts as a dummy region 130C. For example, the dummy region 130C may be located in between the drain region 110D of the transistor 110 and the drain region 120D of the transistor 120. In some embodiments, a dummy gate structure 130G is formed on the dummy region 130C. The dummy gate structure 130G may be electrically floating with respect to the transistors 110, 120, and may be formed to improve process uniformity, without being involved in the operation of the memory cell later formed. In some embodiments, the transistors, semiconductor elements, active or passive devices formed in the semiconductor substrate 102 are fabricated through the front-end-of-line (FEOL) processes.

Referring to FIG. 1, an interconnection structure 200 is formed over the semiconductor substrate 102 to interconnect the active and passive devices formed on the semiconductor substrate 102 in one or more functional circuits. In some embodiments, the interconnection structure 200 includes alternately stacked conductive vias 212 and conductive lines 214 embedded in the interlayer dielectric (ILD) layer(s) 210. In some embodiments, additional electronic elements or devices are integrated within the interconnection structure 200. For example, memory cells may be formed within the interconnection structure 200 and electrically coupled by the conductive lines of the interconnection structure 200 to the underlying transistors 110, 120 accordingly.

As illustrated in FIG. 1, the ILD layer 210 of the interconnect structure 200 extends over the semiconductor substrate 102 and surrounds the gate structures 110G, 120G of the transistors 110, 120 as well as dummy gate structure 130G. In some embodiments, the conductive vias 212 in the ILD layer 210 contacts the source and drain regions 110S/110D, 120S/120D of the transistors 110, 120, and the conductive lines 214 formed over the conductive vias 212 within the ILD layer 210 are electrically coupled to the transistors 110, 120 through the conductive vias 212. For example, the conductive lines 214 may be entrenched in the ILD layer 210 using suitable processes such as damascene, or dual damascene. Moreover, an additional ILD layer 230 may be formed on the ILD layer 210 with conductive vias 232 formed therein to allow further connection.

In some embodiments, the ILD layers 210, 230 are made of or include similar low-k dielectric materials, such as Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. Alternatively, the ILD layer 210 and the ILD layer 230 may be made of or include different materials. For example, the ILD layers 210, 230 may be formed to a suitable thickness by chemical vapor deposition (CVD) (such as flowable CVD (FCVD), high-density plasma CVD (HDP-CVD), or sub-atmospheric CVD (SACVD)), spin-on, sputtering, or other suitable methods. Further, the ILD layers 210, 230 may be respectively patterned to form openings where conductive material will be filled in to respectively form the conductive vias 212, the conductive lines 214 and the conductive vias 232. In some embodiments, a material of the conductive vias 212, the conductive lines 214 and the conductive vias 232 includes aluminum, titanium, copper, nickel, tungsten, and/or alloys thereof. In some embodiments, the conductive vias 212, the conductive lines 214 and the conductive vias 232 are respectively formed through a sequence of deposition (e.g., CVD, plating, or other suitable processes) and planarization steps (e.g., chemical mechanical polishing).

Still referring to FIG. 1, in some embodiments, the stacked structure 10 at least includes a spin Hall electrode layer 320, a magnetic tunnel junction (MTJ) layer stack 330 and a hard mask layer 340 disposed in sequence, which may later be patterned and collectively functioned as a memory cell of the memory device.

As illustrated in FIG. 1, in some embodiments, an optional buffer layer 310 is formed and interposed between the spin Hall electrode layer 320 and the underlying ILD layer 230. For example, the buffer layer 310 extends over and on the ILD layer 230. The buffer layer 310 may include (and, in some embodiments, be formed of) a thin layer of insulating material or dielectric material, such as oxide material, at a thickness ranges from about 5 nm to about 50 nm. In some embodiments, the buffer layer 230 is formed with a thickness that is not too thick to prevent electrical coupling between the transistors 110, 120 and the spin Hall electrode subsequently formed. In some embodiments, the buffer layer 310 is formed by suitable deposition processes, such as CVD, PVD, ALD, or the like. In some embodiments, the buffer layer 310 includes silicon oxide formed by thermal oxidation.

In FIG. 1, in some embodiments, the spin Hall electrode layer 320 is disposed on the buffer layer 310. In some embodiments, the spin Hall electrode layer 320 includes heavy metal such as platinum (Pt), palladium (Pd), beta-phase tungsten ($\beta$-W), beta phase tantalum ($\beta$-Ta); an alloy of the foregoing, such as an alloy of palladium and platinum (e.g., $Pd_{0.25}Pt_{0.75}$), an alloy of gold and platinum (e.g., $Au_{0.25}Pt_{0.75}$); or 2D semiconductor materials such as $Bi_2Se_3$, $WTe_2$, or the like. In some embodiments, spin Hall electrode layer 320 may function as a bottom electrode of the later formed memory cell. In some embodiments, the spin Hall electrode layer 320 is formed by one or more suitable deposition processes such as sputtering or molecular beam epitaxy (MBE), and have a thickness ranging from about 5 nm to 15 nm, or about 10 nm.

In FIG. 1, the MTJ layer stack 330 is disposed on the spin Hall electrode layer 320. In some embodiments, the MTJ layer stack 330 includes, from bottom to top, a free layer 331, a barrier layer 333, a reference layer 335, a synthetic antiferromagnet (SAF) layer 337 and a pinning layer 339, as an exemplary structure. For example, the multiple layers of the MTJ layer stack 330 may be deposited in sequence by different deposition processes such as CVD or PVD processes. It is understood that the number and the configurations of the multiple layers included in the MTJ layer stack 330 may be adjusted and are not particularly limited by the embodiments described herein.

In FIG. 1, in some embodiments, the free layer 331 is a data storage layer having a magnetic moment that is switchable. In some embodiments, the free layer 331 includes one or more ferromagnetic materials, such as cobalt iron boron (CoFeB), cobalt/palladium (CoPd), cobalt iron (CoFe), cobalt iron boron tungsten (CoFeBW), nickel iron (NiFe), ruthenium (Ru), cobalt (Co), alloys thereof, or combinations thereof. In some embodiments, the free layer 331 includes multiple layers made of different materials, such as a layer of Ru between two layers of CoFeB, a layer of Co between two layers of CoFeB, or a layer of Ru and a layer of Co between two layers of CoFeB, though other configurations of layers or materials may be used. A suitable thickness of the free layer 331 may be determined by the composition of the free layer 331 or the magnetic properties of the free layer 331. For example, the thickness of the free layer 331 can be modified depending on whether a perpendicular or an in-plane direction for the stable magnetic states is desired. In one embodiment, the thickness of the free layer 331 ranges from about 0.5 nm to about 3 nm.

In some embodiments, the barrier layer 333 is formed of one or more materials such as magnesium oxide (MgO) and aluminum oxide ($Al_2O_3$), the like, or combinations thereof. A suitable thickness of the barrier layer 333 may be controlled with reference to the resistance of the MTJ layer stack 330. For example, a thicker barrier layer 333 may increase the resistance of the MTJ layer stack 330. In addition, the barrier layer 333 may be thin enough such that electrons are able to tunnel through the barrier layer 333, thus the barrier layer 333 may also be referred to as the tunnel barrier layer 333. In one embodiment, a thickness of the barrier layer 333 ranges from about 0.5 nm to about 1.5 nm.

The reference layer 335 is a second magnetic layer of which the magnetic moment does not change. In some embodiments, the reference layer 335 is formed of any of the same materials as the free layer 331 as set forth above, and has the same material composition as the free layer 331. In some embodiments, the reference layer 335 includes one or more layers of magnetic materials. For example, the reference layer 335 may include a layer of a combination of cobalt (Co), iron (Fe), and boron (B), such as Co, Fe, and B; Fe and B; Co and Fe; Co; and so forth. In one embodiment, the reference layer 335 is formed to a thickness in a range of about 1 nm to about 3 nm.

Generally, the SAF layer 337 may have a three-layer structure (not shown), for example, an antiferromagnetic coupling spacer is sandwiched between a pair of ferromagnetic layers. Alternatively, the SAF layer 337 may be formed from, or include, multiple ferromagnetic layers separated by multiple antiferromagnetic coupling spacers. The ferromagnetic layers may be formed from Co, Fe, Ni or the like, which can be in the form of CoFe, NiFe, CoFeB, CoFeBW, alloys thereof or the like. The antiferromagnetic coupling spacers may be formed from Cu, Ru, iridium (Ir), Pt, W, Ta, Mg, or the like. In some embodiments, a thicker SAF layer has stronger antiferromagnetic properties, or is more robust against external magnetic fields or thermal fluctuation. In one embodiment, an overall thickness of the SAF layer 337 is in a range from about 3 nm to about 6 nm.

The pinning layer 339 is a hard bias layer used to pin the spin polarization direction of the reference layer 335 in a fixed direction. In the embodiment shown in FIG. 1 where the pinning layer 339 is formed over the reference layer 335, the MTJ layer stack 330 is considered as a "top-pinned" MTJ. In alternative embodiments, the order of the layers in the MTJ layer stack 330 may be reversed. In such embodiments, the reference layer 335 is formed over the pinning layer 339, thus such MTJ layer stack can be considered as a "bottom-pinned" MTJ. In some embodiments, the pinning layer 339 includes an anti-ferromagnetic material (AFM) layer such as PtMn or IrMn, and is formed to a thickness in a range from about 15 nm to 30 nm.

A hard mask layer 340 is then disposed on the topmost layer of the MTJ layer stack 330. The hard mask layer 340 may be deposited using any suitable process and may be made of any suitable material. For example, the hard mask layer 340 includes dielectric materials such as silicon oxide, silicon nitride, or silicon oxynitride, or conductive materials, such as tantalum, tungsten, or titanium nitride, or combinations thereof. In some embodiments, the hard mask layer 340 includes multiple layers, for example, a lower layer of the hard mask layer 340 includes tantalum, and an upper layer of the hard mask layer 340 includes silicon nitride, but the disclosure is not limited thereto, and other suitable combinations of materials may be used. In some embodiments, the lower layer of the hard mask layer 340 (i.e., portions including conductive materials) may act as a top electrode.

FIG. 2 through FIG. 6 are schematic cross-sectional views showing a portion of the structure as shown in FIG. 1 at various stages of a manufacturing method of a memory device in accordance with some embodiments of the present disclosure. It should be noted that the below portions of the stacked structure 10 (e.g., portions below the buffer layer 310) are not shown in FIG. 2 through FIG. 6 for the purpose of simplicity and clarity. As illustrated in FIG. 2 through FIG. 6, the spin Hall electrode layer 320, the MTJ layer stack 330 and the hard mask layer 340 are patterned and a memory cell MC-1 (see FIG. 5 and FIG. 6) as part of a memory device 12.

Figure 2:
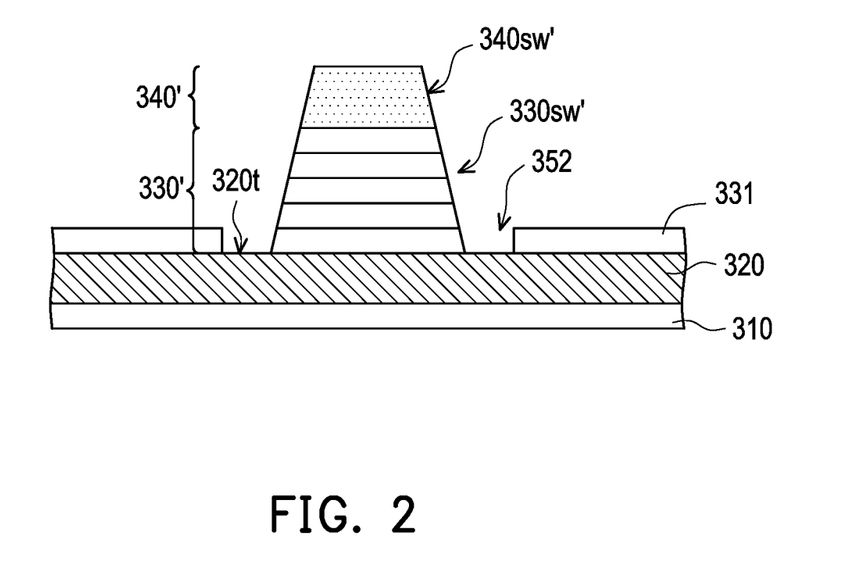

Referring to FIG. 2, the hard mask layer 340 and the MTJ layer stack 330 are patterned using one or more suitable etching processes, in accordance with some embodiments of the present disclosure. In some embodiments, a method of patterning the hard mask layer 340 and the MTJ layer stack 330 includes forming a masking pattern (not shown) over the hard mask layer 340, and performing one or more etching processes on unmasked regions of the hard mask layer 340 and the MTJ layer stack 330 to remove unmasked portions of the hard mask layer 340 and the MTJ layer stack 330, and then the masking pattern is removed. In some embodiments, the spin Hall electrode layer 320 may act as an etch stop layer during multiple etching steps, and the hard mask layer 340 and the MTJ layer stack 330 are patterned until the spin Hall electrode layer 320 is exposed. The etching may be any acceptable etch process, such as dry etching, a reactive ion etching (RIE), neutral beam etching (NBE), inductively coupled plasma etching (ICP), ion-beam etching (IBE), the like, or a combination thereof. The etching process may be anisotropic. For example, an ICP etching may be performed initially to define a MTJ pillar 330' and a hard mask 340' overlying the MTJ pillar 330'. An IBE process may then be performed to remove metal residue on a sidewall 330$sw'$ of the MTJ pillar 330' and a sidewall 340$sw'$ of the hard mask 340' induced by the previous ICP etching.

Following the patterning of the hard mask layer 340 and the MTJ layer stack 330, the stacked structure of the hard mask 340' and the MTJ pillar 330' (the hard mask 340' stacked on top of the MTJ pillar 330') is formed in the intended corresponding location of the memory cell MC-1. In some embodiments, the MTJ pillar 330' includes a tapered sidewall(s) 330$sw'$ and the hard mask 340' includes a tapered sidewall(s) 340$sw'$, depending on the patterning conditions. In one embodiment, the stacked structure of the MTJ pillar 330' and the hard mask 340' may be shaped liked a truncated cone and the tapered sidewalls 330$sw'$ and 340$sw'$ are coplanar with each other to form a continuous sidewall with the same slope. In some embodiments, a certain portion of the MTJ layer stack 330 in unmasked region is not fully removed during the patterning. For example, as illustrated in FIG. 2, after patterning, the MTJ layer stack 330 is etched through to form the MTJ pillar 330' and to expose the underlying spin Hall electrode layer 320 but the unmasked bottommost free layer 331 is not etched off. With the presence of the remaining free layer 331, a trench 352 that surrounds the MTJ pillar 330' and exposes a top surface 320$t$ of the spin Hall electrode layer 320 is formed. That is, the remaining portion of the free layer 331 on the spin Hall electrode layer 320 defines the ring-shaped trench 352.

Figure 3:
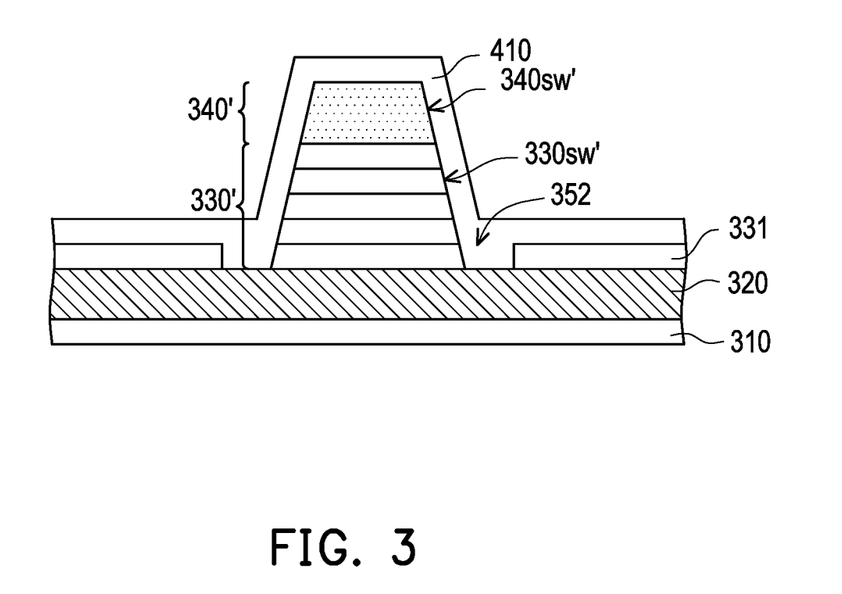

In FIG. 3, a spacer layer 410 is blanketly deposited over the patterned MTJ pillar 330' and the overlying hard mask 340'. In some embodiments, the spacer layer 410 globally covers the whole area where the memory cell MC-1 is to be formed. In some embodiments, the spacer layer 410 is formed on and covers the remaining portion of the free layer 331 and fills up the trench 352. In some embodiments, the spacer layer 410 conformally covers the sidewalls 330$sw'$, 340$sw'$ of the MTJ pillar 330' and the hard mask 340' and the top surface of the hard mask 340'. In some embodiments, the spacer layer 410 includes a dielectric material such as silicon carbide, silicon oxycarbide, silicon nitride, silicon oxide, silicon oxynitride, silicon oxycarbonitride, or other suitable dielectric materials. In some embodiments, the spacer layer 410 is formed using any suitable deposition technique, such as PVD, CVD, ALD, the like, or a combination thereof. In one embodiment, the spacer layer 410 includes silicon nitride formed by ALD.

Figure 4:
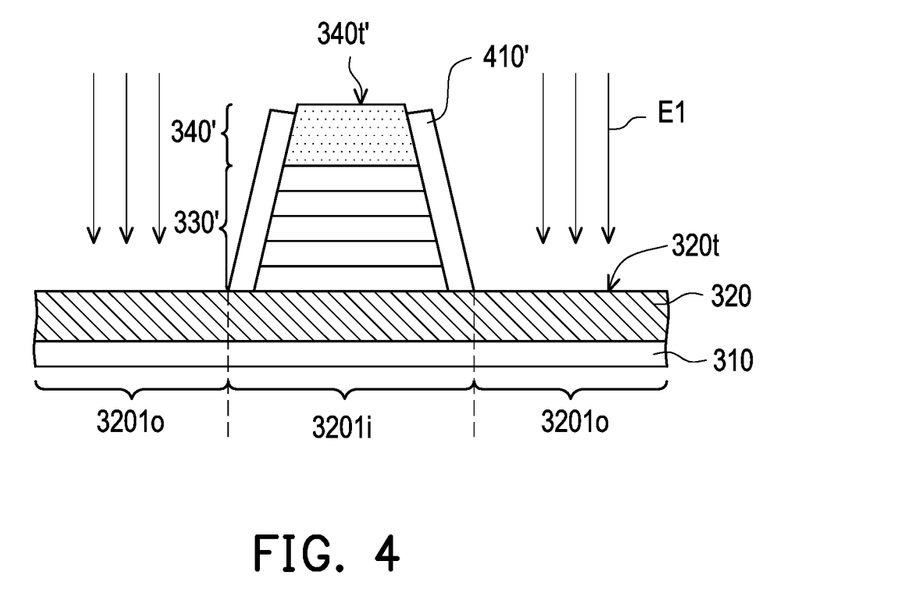

Referring to FIG. 4, a spacer 410' is subsequently formed by etching back the spacer layer 410 via one or more etching steps. The etching back process may include any acceptable etching process, such as dry etching, RIE, NBE, the like, or a combination thereof. The etching process may be anisotropic, for example, lateral portions of the spacer layer 410 may be removed. In addition, in embodiments where the spacer layer 410 is formed of silicon nitride, the spacer layer 410 may be patterned by a RIE process using $NH_3$ as an etchant E1. In such embodiments, the ratio of etching rate of a material of the spacer layer 410 (i.e., silicon nitride) with respect to a material of the free layer 331 (such as CoFe) may be about 1:1. In other words, during the etching back of the spacer layer 410, the remaining portion of the free layer 331 and the lateral portions of the spacer layer 410 are removed together by the etchant E1 such that a top surface 340$t'$ of the hard mask 340' and the top surface 320$t$ of the spin Hall electrode layer 320 is exposed.

As shown in FIG. 4, the spacer 410' vertically surrounds the MTJ pillar 330' and the hard mask 340' after the etching back process. In one embodiment, the spacer 410" is shaped like a truncated cone wall surrounding the MTJ pillar 330' and the hard mask 340' with the top surface 340$t'$ of the hard mask 340' is exposed. In some embodiments, the spacer 410' physically contacts and covers a portion of the spin Hall electrode layer 320 surrounding and beside the MTJ pillar 330' and further provide protection for the underlying portion of the spin Hall electrode layer 320 during the following global etching process. In further embodiments, a portion of the spin Hall electrode layer 320 that is covered by the MTJ pillar 330' and the spacer 410' is referred to as an inner portion 3201$i$ of the subsequently patterned spin Hall electrode layer 3201, and an uncovered portion of the spin Hall electrode layer 320 is referred to as an outer portion 3201$o$ of the subsequently patterned spin Hall electrode layer 3201.

Subsequent to the formation of the spacer 410', a global etching process may be performed on the outer portion 3201$o$ of the spin Hall electrode layer 320 to form a patterned spin Hall electrode layer 3201. For example, the global etching process is performed to recess the outer portion 3201$o$ of the spin Hall electrode layer 320 to below the inner portion 3201$i$ of the spin Hall electrode layer 320. The global etching process may include any acceptable etch process, such as dry etching, RIE, NBE, the like, or a combination thereof. Similarly, the global etching process may be anisotropic. In some embodiments, the global etching partially removes upper portions of the spacer 410'. In one embodiment, the global etching process includes a RIE process using $CF_4$ as an etchant E2.

Figure 5:
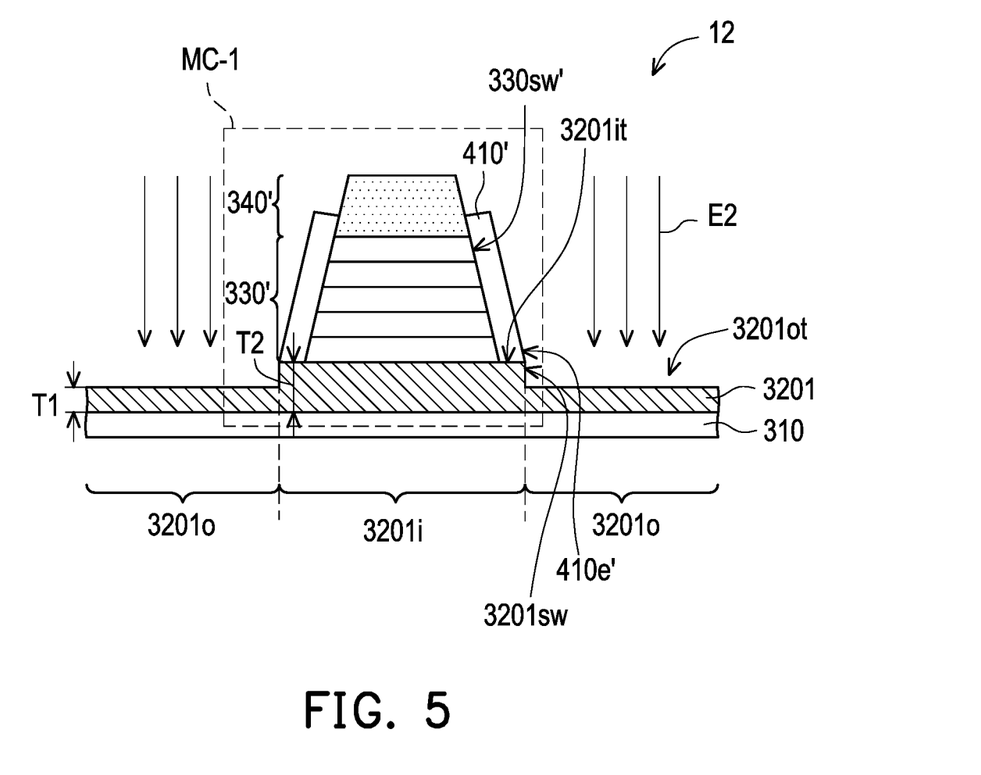

As shown in FIG. 5, the outer portion 3201$o$ of the patterned spin Hall electrode layer 3201 may include a flat top surface 3201$ot$ with a uniform thickness T1 after the global etching process. In addition, a thickness T2 of the inner portion 3201$i$ of the patterned spin Hall electrode layer 3201 may be substantially the same as the thickness of the originally deposited spin Hall electrode layer 320 that ranges from about 5 nm to about 15 nm, since the inner portion 3201$i$ of the patterned spin Hall electrode layer 3201 is shielded and protected by the MTJ pillar 330' and the spacer 410' during the global etching process. For example, the thickness T2 of the inner portion 3201$i$ may be about 10 nm. In embodiments where the thickness T2 is around 10 nm, the thickness T1 of the outer portion 3201$o$ may be in a range of about 5 nm to about 7 nm. In other words, about 30% to about 50% of the spin Hall electrode layer 320 in the outer region may be consumed during the global etching process. The thickness T1 of the outer portion 3201$o$ can be determined according to a desired resistance of the patterned spin Hall electrode layer 3201 to allow a current flow through the outer portion 3201$o$ of the patterned spin Hall electrode layer 3201.

Up to here, the memory cell MC-1 of the memory device 12 according to some embodiments of the present disclosure is formed. The memory cell MC-1 includes the patterned spin Hall electrode layer 3201 and the hard mask 340' that respectively functions as bottom electrode and top electrode, and the MTJ pillar 330' located therebetween. In some embodiments, the memory cell MC-1 further includes the spacer 410' that is at least on the sidewall 330$sw'$ of the MTJ pillar 330'. In some other embodiments, the patterned spin Hall electrode layer 3201 includes an inner portion 3201$i$ and an outer portion 3201$o$ around the inner portion 3201$i$.

In addition, a bottom edge 410e' of the spacer 410' is vertically aligned to a sidewall 3201sw of the inner portion 3201i of the patterned spin Hall electrode layer 3201. In some embodiments, a top surface 3201it (i.e., the top surface 320t) of the inner portion 3201i is located at a position that is higher than the top surface 3201ot of the outer portion 3201o. In such embodiments, the patterned spin Hall electrode layer 3201 includes a stair-like shape that has two steps.

Figure 6:
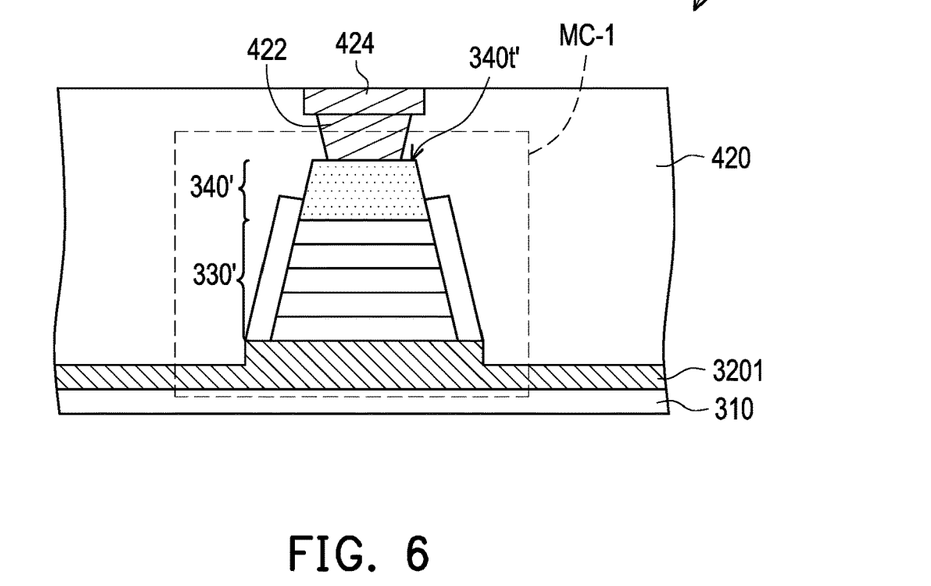

Turning to FIG. 6, an ILD layer 420 is formed to encapsulate the memory cell MC-1. Materials and processes to form the ILD layer 420 may be selected as previously described with reference to the ILDs 210, 230. For example, the ILD layer 420 is formed of $SiO_2$ using deposition technique such as CVD, FCVD, or the like. In some embodiments, the ILD layer 420 is formed to a sufficient thickness to completely cover the memory cell MC-1 even after planarization is performed. In some alternative embodiments, the ILD layer 420 is patterned to form an opening that exposes the top surface 340t' of the hard mask 340'. Further, a conductive via 422 is formed within the opening that extends through the ILD layer 420 so as to electrically connect the MTJ pillar 330' and conductive lines 444 to be formed above the conductive via 422. Materials and processes to form the conductive via 422 and the conductive lines 424 may be selected as previously described for the conductive vias 212, 232 and the conductive lines 214. In some embodiments, a bottom surface of the conductive via 422 is in directly contact with the top surface 340t' of the hard mask 340'. In some embodiments, additional process steps may be further included, for example to form additional interconnection tiers or to provide connective bumps to allow integration of the memory device 12 within larger devices.

In some embodiments, the memory device 12 may be or include a spin orbit torque magnetic random access memory (SOT-MRAM). Generally, in the SOT-MRAM, the magnetic moment of free layer of the MTJ is switched by the spin current generated through the spin-orbit interaction effect when flowing an electrical current Jc adjacent to the free layer of the MTJ. Manipulating the orientation of the free layer causes a resistance change of the MTJ, and such change may be used to record a data value in the memory cell. The magnetic moment of the free layer may be switched by spin-orbit torque only or with an auxiliary magnetic field, with spin-transfer torque, with bias voltage across barrier layer. There are three general types of SOT-MRAMs, classified according to the orientation relationship between the easy axis of the free layer and the write current Jc flowing through the spin Hall electrode. An x-type SOT-MRAM has a free layer easy axis which is parallel to the Jc current through the spin Hall electrode and an auxiliary magnetic field which is perpendicular to the plane of the current flow in the spin Hall electrode. A y-type of SOT-MRAM has a free layer easy axis which is perpendicular to, but in the same plane as, the direction of the Jc current through the spin Hall electrode. A z-type of SOT-MRAM has a free layer easy axis which is perpendicular to the plane of the Jc current flowing through the spin Hall electrode and an auxiliary magnetic field is needed which is parallel to the flow of the Jc current. While in the following an x-type SOT-MRAM is discussed, the disclosure is not limited thereto, and other types of SOT-MRAMs are also contemplated within the scopes of the present disclosure.

Figure 7:
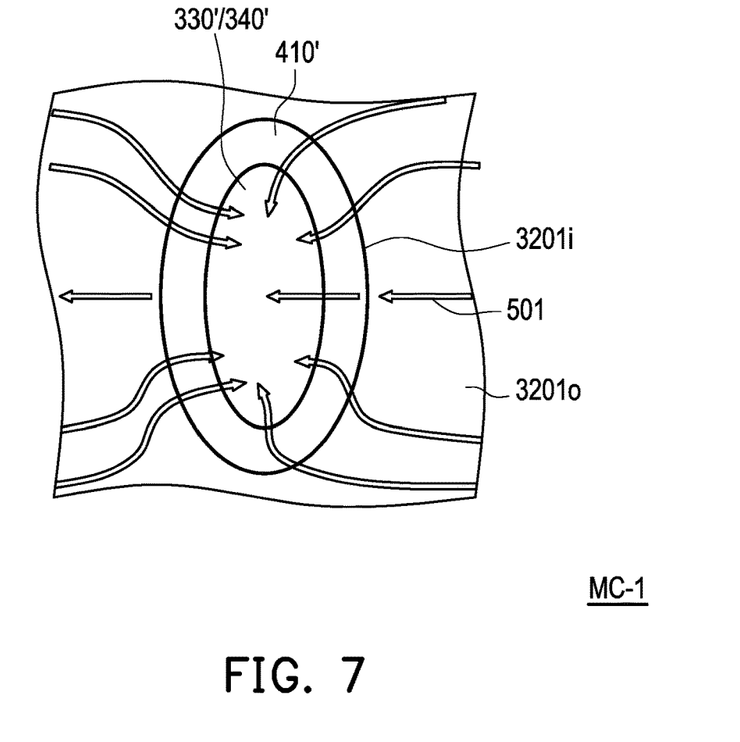
FIG. 7 is a schematic top view illustrating the current flow of the structure shown in FIG. 6 in accordance with some embodiments of the present disclosure.

FIG. 7 is a schematic top view of the structure shown in FIG. 6 according to some embodiments of the disclosure. In FIG. 7, the ILD layer 420, the conductive via 422 and the conductive lines 424 are omitted for clarity. Referring to FIG. 6 and FIG. 7 together, the MTJ pillar 330' and the hard mask 340' may collectively include a truncated cone structure, and the hard mask 340' may be generally elliptical or circular from a top view. When seen from the top view, the spacer 410' surrounds the MTJ pillar 330' and the hard mask 340' and thus includes an annular ring shape. In addition, the inner portion 3201i of the patterned spin Hall electrode layer 3201 is directly under and covered by the MTJ pillar 330' and the spacer 340, and the outer portion 3201o surrounds the inner portion 3201i.

As discussed above, unlike the outer portion 3201o of the patterned spin Hall electrode layer 3201, the inner portion 3201i of the patterned spin Hall electrode layer 3201 does not undergo the global etching process, thereby the thickness T2 of the inner portion 3201i is greater than the thickness T1 of the outer portion 3201o. Owing to the thickness difference, a resistance of the inner portion 3201i is lower than a resistance of the outer portion 3201o. As a result, the current Jc may be more likely to flow into the inner portion 3201i of the patterned spin Hall electrode layer 3201 from the outer portion 3201o of the patterned spin Hall electrode layer 3201 and flow through the overlying MTJ pillar 330'. The flow orientation of the current Jc is indicated by arrow 501 in FIG. 7.

Figure 8:
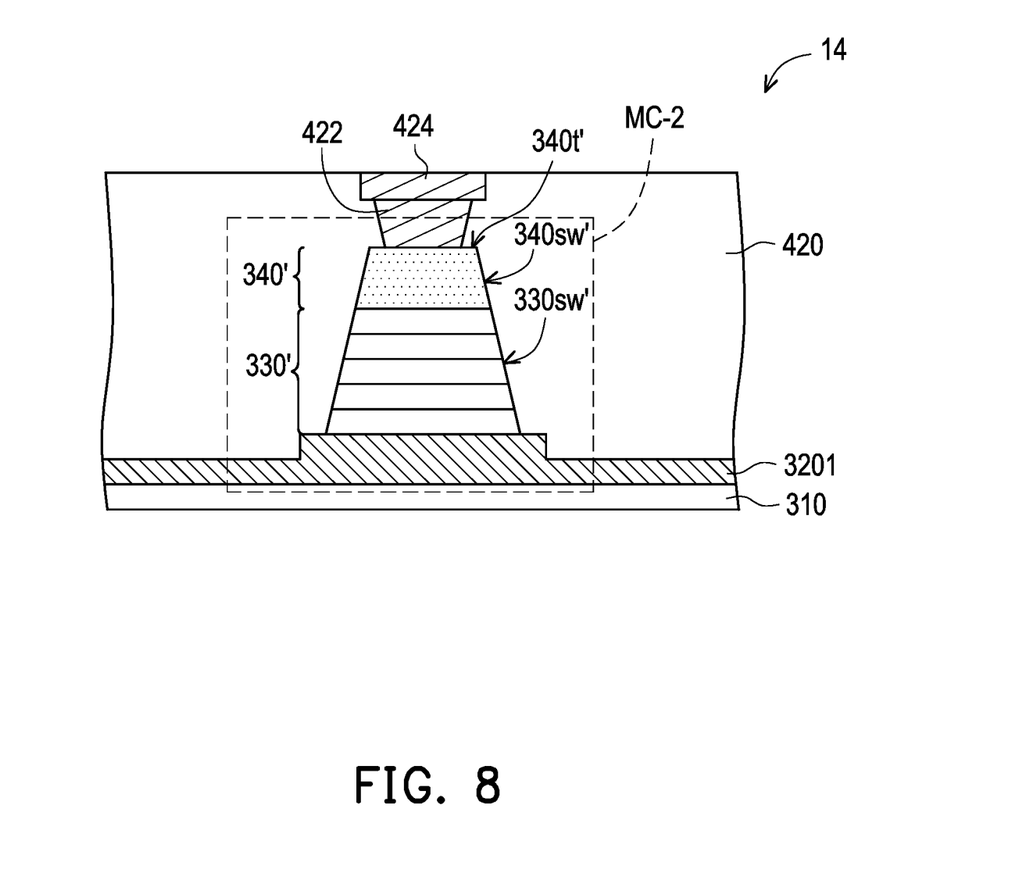
FIG. 8 is a schematic cross-sectional view of a memory cell of a memory device in accordance with some embodiments of the present disclosure.

FIG. 8 is a schematic cross-sectional view of a memory cell MC-2 of a memory device 14 according to some embodiments of the present disclosure. The memory cell MC-2 of the memory device 14 is similar to the memory cell MC-1 of the memory device 12. The only difference between the memory cell MC-2 and the memory cell MC-1 is that the spacer 410' is removed, in accordance with some embodiments of the present disclosure. For example, after the global etching process and prior to the formation of the ILD layer 420, the conductive vias 422 and the conductive lines 424, an etching process may be performed to selectively remove the spacer 410'. The sidewalls 330sw', 340sw' of the MTJ pillar 330' and the hard mask 340' may be exposed after the removal of the spacer 410', as shown in FIG. 8. Similarly, the memory cell MC-1 includes the patterned spin Hall electrode layer 3201 that includes the stair-like shape with two steps, thus the current intends to flow into the central portion of the patterned spin Hall electrode layer 3201 from the peripheral portion of the patterned spin Hall electrode layer 3201 and flow through the overlying MTJ pillar 330'.

FIG. 9 through FIG. 13 are schematic cross-sectional views showing a portion of the structure at various stages of a manufacturing method of a memory device in accordance with some embodiments of the present disclosure. The manufacturing steps shown in FIG. 9 through FIG. 13 may be performed on a structure that is similar or substantially the same as the stacked structure shown in FIG. 1, and below portions of the structure (e.g., portions below the buffer layer 310) are not shown in FIG. 9 through FIG. 13 for the purpose of simplicity and clarity. In addition, for clarity and simplicity, similar features in FIG. 2 through FIG. 6 and FIG. 9 through FIG. 13 are identified by the same reference numerals and the previously described details will not be repeated herein.

According to some embodiments, in FIG. 9 through FIG. 13, the spin Hall electrode layer 320, the MTJ layer stack 330 and the hard mask layer 340 are patterned so as to form a memory cell MC-3 (see FIG. 12 and FIG. 13) of a memory device 16.

Figure 9:
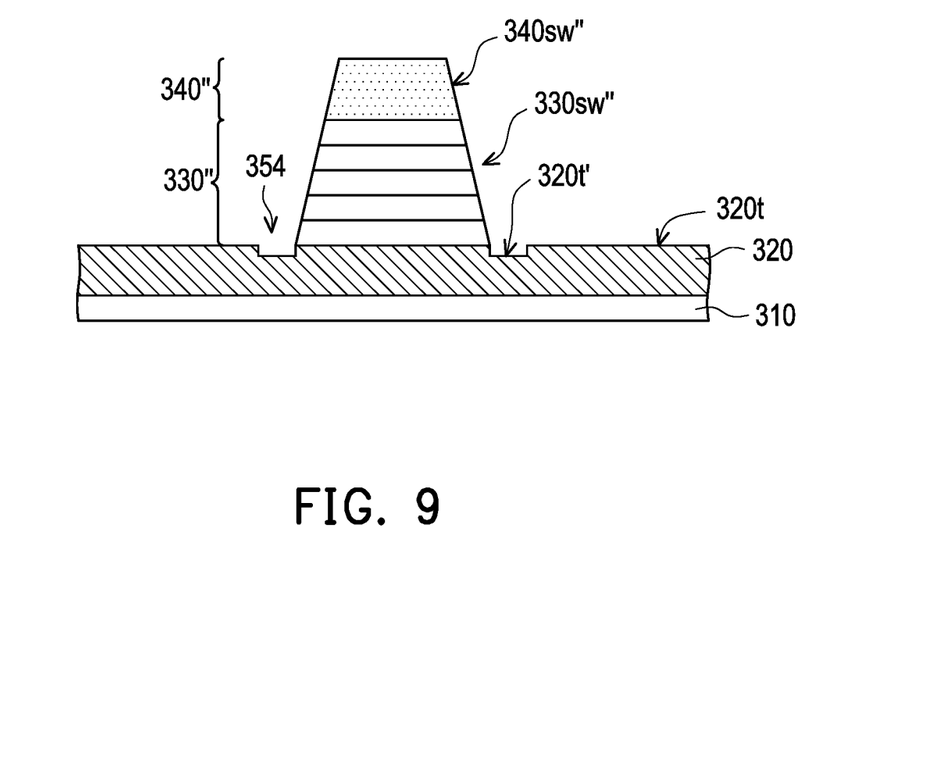
FIG. 9 through FIG. 13 are schematic cross-sectional views showing a portion of the structure at various stages of a manufacturing method of a memory device in accordance with some embodiments of the present disclosure.

Referring to FIG. 9, the hard mask layer 340 and the MTJ layer stack 330 are patterned to define an MTJ pillar 330'' and a hard mask 340" overlying the MTJ pillar 330" using one or more etching steps. The etching processes which are similar to, or the same as, those described previously are not repeated herein. As illustrated in FIG. 9, in some embodiments, the undesired portions (i.e. unmasked portions of the previously described masking pattern) of MTJ layer stack 330 and the hard mask layer 340 is fully removed by the etching processes to expose a top surface 320$t$ of the spin Hall electrode layer 320. In some embodiments, due to process variations, a portion of the spin Hall electrode layer 320 may be over-etched at a region around the MTJ pillar 330" to be defined. In other words, an annular trench 354 encircling the as-defined MTJ pillar 330" may be etched more (or deeper) to a depth and expose a top surface 320$t'$ of the spin Hall electrode layer 320. The top surface 320$t'$ is located in a position lower than the top surface 320$t$.

In some embodiments, the MTJ pillar 330" and the hard mask 340" may be formed in the intended corresponding location of the memory cell MC-3. In some embodiments, a sidewall 330$sw$" of the MTJ pillar 330" and a sidewall 340$sw$" of the hard mask 340" are tapered, depending on the patterning conditions. In one embodiment, the stacked structure of the MTJ pillar 330" and the hard mask 340" may be shaped liked a truncated cone and the tapered sidewalls 330$sw$" and 340$sw$" are coplanar with each other to form a continuous sidewall with the same slope.

Figure 10:
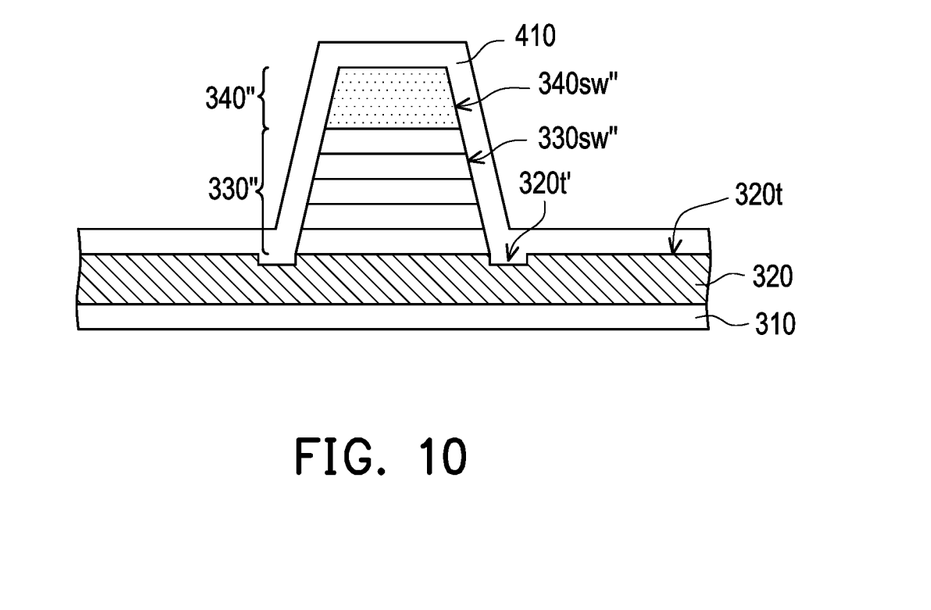

Referring to FIG. 10, a spacer layer 410 is blanketly deposited over the patterned MTJ pillar 330" and the overlying hard mask 340". The spacer layer 410 may globally covers the whole area where the memory cell MC-3 is to be formed. In some embodiments, the spacer layer 410 conformally covers the top surfaces 320$t$, 320$t'$ of the spin Hall electrode layer 320 and the sidewalls 330$sw$", 340$sw$" of the MTJ pillar 330" and the hard mask 340". Materials and processes for the spacer layer 410 which are similar to, or the same as, those described previously are not repeated herein.

Figure 11:
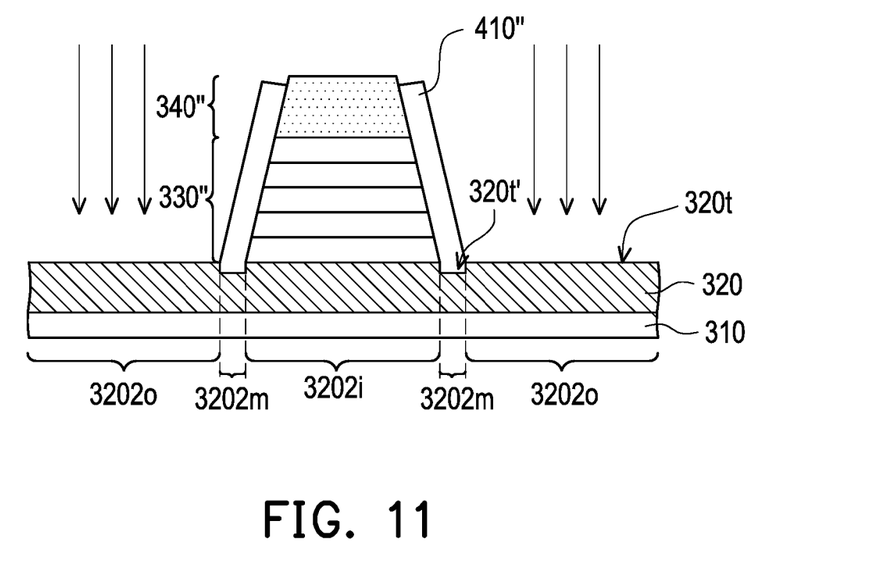

Referring to FIG. 11, the spacer layer 410 is etched back to form a spacer 410" using one or more etching steps. The etching back processes which are similar to, or the same as, those described previously are not repeated herein. In some embodiments, portions of the spacer layer 410 laterally on the spin Hall electrode layer 320 and the hard mask 340" are removed after the etching back process. For example, the spin Hall electrode layer 320 may act as an etching stop layer. In such embodiment, the etching back process includes a dry etching process that has high etching selectivity of the spacer layer 410 relative to the spin Hall electrode layer 320.

Subsequent to the etching back of the spacer layer 410, the top surface 320$t$ is exposed while the top surface 320$t'$ remains covered by the spacer 410", as shown in FIG. 11. In some embodiments, a portion that is covered by the MTJ pillar 330" may be referred to as an inner portion 3202$i$ of the subsequently patterned spin Hall electrode layer 3202, a portion that is covered by the spacer 410" may be referred to as a middle portion 3202$m$ of the subsequently patterned spin Hall electrode layer 3202, and an uncovered portion may be referred to as an outer portion 3202$o$ of the subsequently patterned spin Hall electrode layer 3202. In other words, the inner portion 3202$i$ may be directly below the MTJ pillar 330" and the middle portion 3202$m$ may be directly below the spacer 410". As illustrated in FIG. 11, the spacer 410" is located within the trench 354 (i.e., on the middle portion 3202$m$) and vertically surrounds the MTJ pillar 330" and the hard mask 340".

Figure 12:
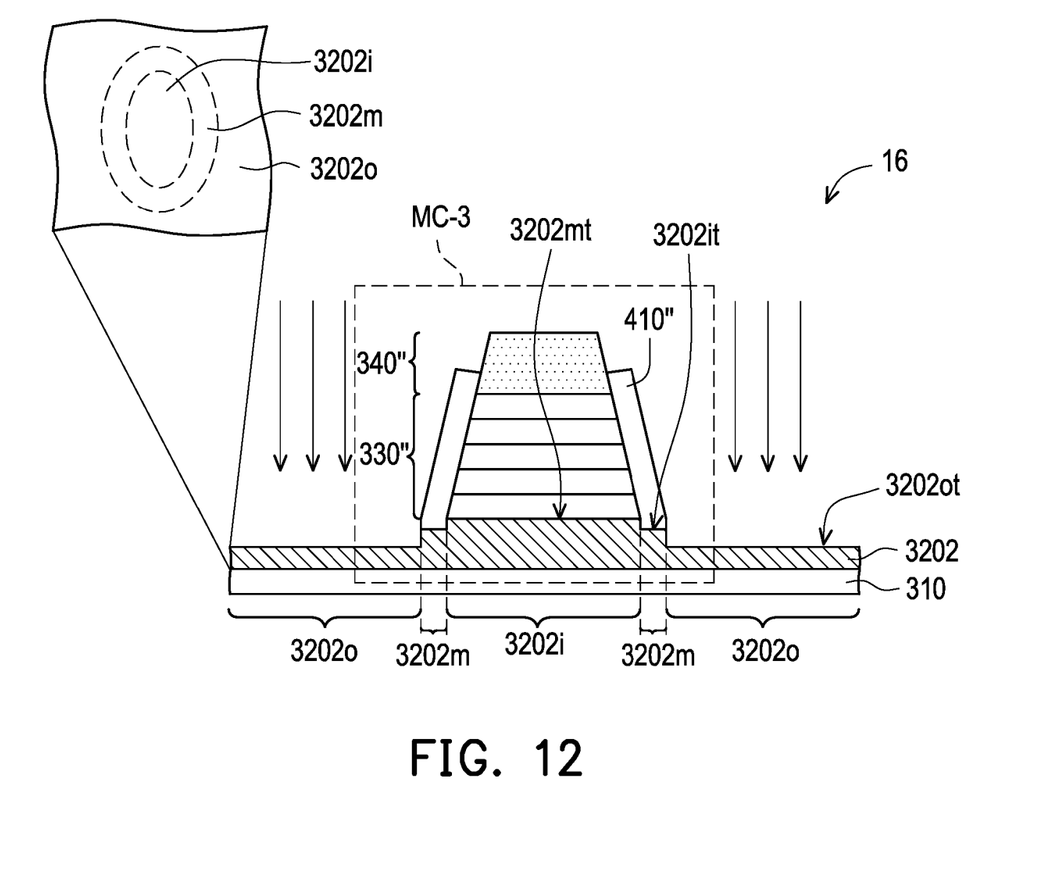
Figure 13:
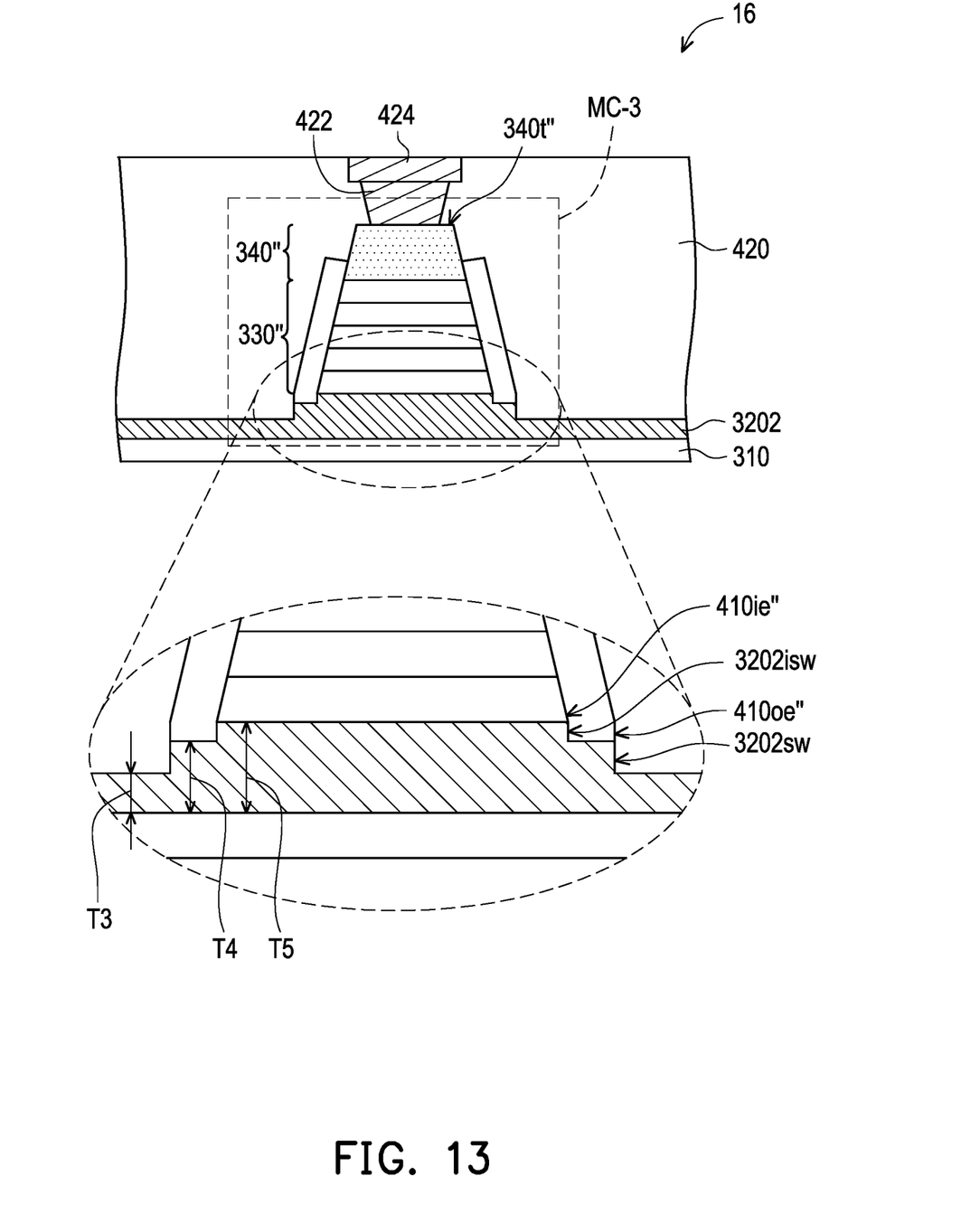

Referring to FIG. 12 and FIG. 13, the memory cell MC-3 is formed by performing a globally etching on the outer portion 3202$o$, and the memory cell MC-3 is then encapsulated by an ILD layer 420 and connected to a conductive via 422 and conductive lines 424 within the ILD layer 420. Materials and processes for the global etching process and the formation of the ILD layer 420, the conductive via 422 and conductive lines 424 which are similar to, or the same as, those described previously are not repeated herein. As shown in FIG. 12 and FIG. 13, the outer portion 3202$o$ of the patterned spin Hall electrode layer 3202 may be recessed such that a top surface 3202$ot$ of the outer portion 3202$o$ is below a top surface 3202$mt$ of the middle portion 3202$m$, and upper portions of the spacer 410" may also be partially removed during the global etching process. Further, the conductive via 422 and the conductive lines 424 are, for example, in physical contact with the hard mask 340" of the memory cell MC-3 to provide external electrical connection of the memory cell MC-3. As noted above, additional process steps may be further included, for example to form additional interconnection tiers or to provide connective bumps to allow integration of the memory device 16 within larger devices.

Still referring to FIG. 12 and FIG. 13 together, the memory cell MC-3 includes the patterned spin Hall electrode layer 3202 and the hard mask 340" that respectively functions as bottom electrode and top electrode, and the MTJ pillar 330" located therebetween. In some embodiments, the memory cell MC-3 further includes the spacer 410" that is at least on the sidewall 330$sw$" of the MTJ pillar 330". In some embodiments, the patterned spin Hall electrode layer 3202 includes an inner portion 3202$i$, a middle portion 3202$m$ encircling the inner portion 3202$i$ and an outer portion 3202$o$ surrounding the middle portion 3202$m$. For example, as shown in a cross-sectional plan view (horizontal direction) of the patterned spin Hall electrode layer 3202 in FIG. 13, the middle portion 3202$m$ of the patterned spin Hall electrode layer 3202 is in a ring shape in corresponding to the vertical projection of the spacer 410".

As shown in the enlarged partial view of FIG. 13, after the global etching process, the outer portion 3202$o$ of the patterned spin Hall electrode layer 3202 is substantially flat and includes a uniform thickness T3. Further, the middle portion 3202$m$ includes a thickness T4, and the inner portion 3202$i$ includes a thickness T5, respectively. The thickness T5 of the inner portion 3202$i$ may be substantially the same as the thickness of the originally deposited spin Hall electrode layer 320 that ranges from about 5 nm to about 15 nm. In some embodiments, the thickness T4 of the middle portion 3202$m$ is slightly less than the thickness T5 of the inner portion 3202$i$ due to the over-etching as described above with reference to FIG. 9. In some embodiments, the thickness T3 of the outer portion 3202$o$ is less than the thickness T4 of the middle portion 3202$m$. In one embodiment, the thickness T3 may be about or greater than 4 nm, the thickness T5 may be about or less than 10 nm, and the thickness T4 may be any suitable thickness between the thickness T3 and the thickness T5.

As shown in the enlarged partial view of FIG. 13, an inner bottom edge 410$ie$" of the spacer 410" is vertically aligned with a sidewall 3202$isw$ of the inner portion 3202$i$ of the underlying patterned spin Hall electrode layer 3202, and an outer bottom edge 4100$e$" of the spacer 410" is vertically aligned with a sidewall 3202$sw$ of the middle portion 3202$m$ of the underlying patterned spin Hall electrode layer 3202. In some embodiments, a top surface 3202$it$ of the inner portion 3202$i$ is higher (i.e. located at a higher horizontally level) than the top surface 3202$mt$ of the middle portion 3202$m$, and the top surface 3202$mt$ of the middle portion 3202m is higher (i.e. located at a higher horizontally level) than a top surface 3202ot of the outer portion 3202o. In such embodiments, the patterned spin Hall electrode layer 3202 has a schematic stair-like shape side view.

Figure 14:
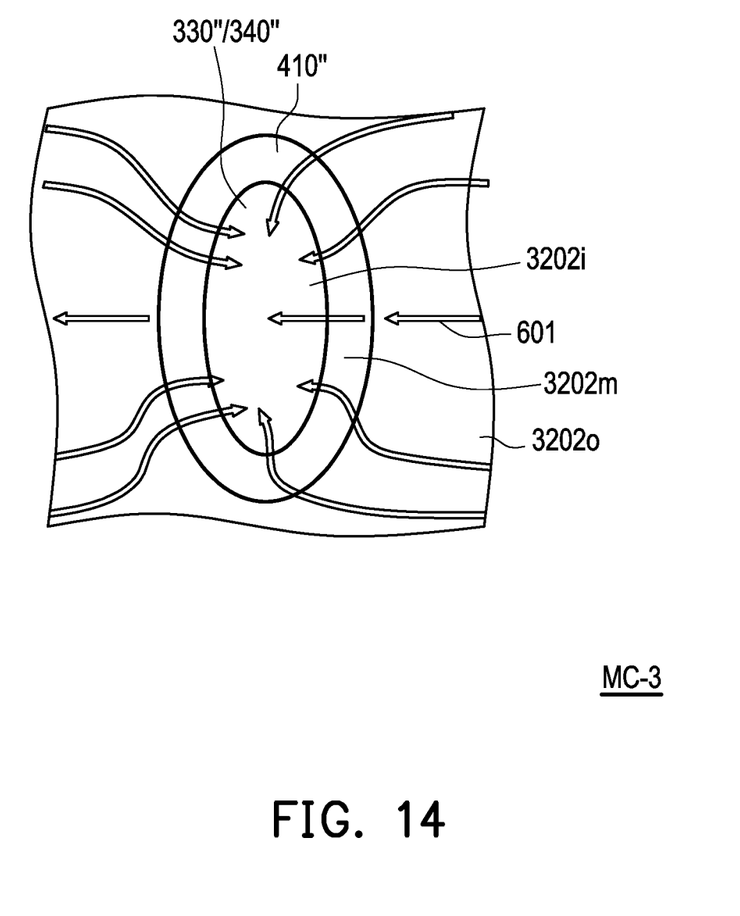
FIG. 14 is a schematic top view illustrating the current flow of the structure shown in FIG. 13 in accordance with some embodiments of the present disclosure.

FIG. 14 is a schematic top view of the structure shown in FIG. 13 according to some embodiments of the disclosure. In FIG. 14, the ILD layer 420, the conductive via 422 and conductive lines 424 are omitted for clarity. Referring to FIG. 13 and FIG. 14 together, the MTJ pillar 330" and the hard mask 340" may collectively include a truncated cone structure, and the hard mask 340" may be generally elliptical or circular from a top view. When seen from the top view, the spacer 410" surrounds the MTJ pillar 330" and the hard mask 340" and thus includes an annular ring shape. As discussed above, the thicknesses T5 and T4 respectively of the inner portion 3202i and the middle portion 3202m are greater than the thickness T3 of the outer portion 3202o. Owing to the thickness difference, a resistance of the inner portion 3202i is way lower than a resistance of the outer portion 3202o. As a result, the current Jc may be more likely to flow into the inner portion 3202i from the outer portion 3202o through the middle portion 3202m and flow through the overlying MTJ pillar 330". The flow orientation of the current Jc is indicated by arrow 601 in FIG. 14.

Figure 15:
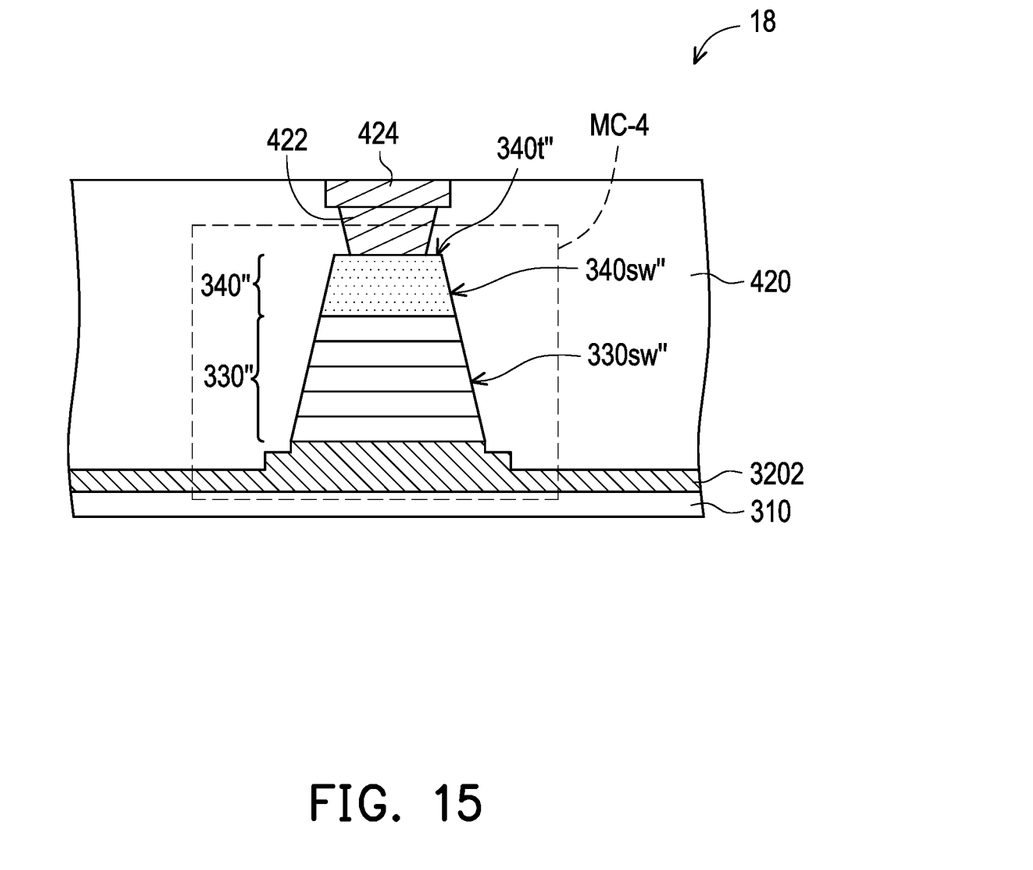
FIG. 15 is a schematic cross-sectional view of a memory cell of a memory device in accordance with some embodiments of the present disclosure.

FIG. 15 is a schematic cross-sectional view of a memory cell MC-4 of a memory device 18 according to some embodiments of the present disclosure. The memory cell MC-4 of the memory device 18 is similar to the memory cell MC-3 of the memory device 16. The only difference between the memory cell MC-4 and the memory cell MC-3 is that the spacer 410" is removed, in accordance with some embodiments of the present disclosure. For example, after the global etching process and prior to the formation of the ILD layer 420, the conductive vias 422 and the conductive lines 424, an etching process may be performed to selectively remove the spacer 410". The sidewalls 330sw", 340sw" of the MTJ pillar 330" and the hard mask 340" may be exposed after the removal of the spacer 410", as shown in FIG. 15. Similarly, the memory cell MC-4 includes the stair-like shape spin Hall electrode layer 3202, thus the current intends to flow into the central portion of the patterned spin Hall electrode layer 3202 from the peripheral portion of the patterned spin Hall electrode layer 3202 and flow through the overlying MTJ pillar 330".

In accordance with another embodiment of the disclosure, a memory cell is described. The memory cell includes a spin Hall electrode layer, an MTJ pillar, a hard mask, and a spacer. The MTJ pillar is disposed on the spin Hall electrode layer, the hard mask is disposed on the MTJ pillar, and the spacer is disposed on sidewalls of the MTJ pillar and the hard mask. Suitably, the spin Hall electrode layer at least comprises an inner portion and an outer portion surrounding the inner portion, and a top surface of the outer portion is lower than a top surface of the inner portion.

In accordance with an embodiment of the disclosure, a memory device is described. The memory device includes a semiconductor substrate, an interconnect structure and a memory cell. The interconnect structure is disposed over the semiconductor substrate, and the memory cell is disposed over the interconnect structure and electrically coupled with the semiconductor substrate and the interconnect structure. The memory cell includes a top electrode, a bottom electrode, and an MTJ structure between the top electrode and the bottom electrode. Suitably, the bottom electrode comprises an inner portion of a first thickness and an outer portion of a second thickness surrounding the inner portion, the MTJ structure is located on the inner portion of the bottom electrode, and the first thickness is larger than the second thickness.

In accordance with yet another embodiment of the disclosure, a method of manufacturing a memory device is described. The method includes at least the following steps. Providing a semiconductor substrate that has transistors formed therein. Forming a spin Hall electrode layer over the semiconductor substrate and electrically coupled to the transistors. Forming an MTJ layer stack over the spin Hall electrode layer. Forming a hard mask layer over the MTJ layer stack. Patterning the MTJ layer stack and the hard mask layer to form an MTJ pillar and a hard mask over the MTJ pillar and define a trench beside the MTJ pillar. Depositing a spacer layer conformally covering the spin Hall electrode layer, the MTJ pillar, the hard mask and the trench. Etching the spacer layer to form a spacer on sidewalls of the MTJ pillar and the hard mask, wherein the MTJ pillar, the hard mask and the spacer together covers a portion of the spin Hall electrode layer. Forming a recess in the uncovered spin Hall electrode layer beside the spacer by performing a global etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a spin Hall electrode layer;
a magnetic tunneling junction (MTJ) pillar disposed on the spin Hall electrode layer;
a hard mask disposed on the MTJ pillar; and
a spacer disposed on sidewalls of the MTJ pillar and the hard mask, wherein the spin Hall electrode layer at least comprises an inner portion and an outer portion surrounding the inner portion, and a top surface of the outer portion is lower than a top surface of the inner portion,
wherein a bottom edge of an outer sidewall of the spacer and a sidewall of the inner portion of the spin Hall electrode layer are substantially vertically aligned with each other.

2. The memory cell of claim 1, wherein the MTJ pillar and the hard mask together are shaped as a truncated cone, and the spacer is shaped as a truncated cone wall.

3. The memory cell of claim 1, wherein the spacer falls within a perimeter of the sidewall of the inner portion of the spin Hall electrode layer.

4. The memory cell of claim 1, wherein the MTJ pillar and the spacer are located on the inner portion of the spin Hall electrode layer.

5. The memory cell of claim 1, wherein the inner portion of the spin Hall electrode layer comprises a first portion that is directly below the MTJ pillar and a second portion that is directly below the spacer, and a top surface of the second portion is lower than a top surface of the first portion.

6. The memory cell of claim 1, wherein a material of the spacer includes silicon carbide, silicon oxycarbide, silicon nitride, silicon oxide, silicon oxynitride, silicon oxycarbonitride or a combination thereof.

7. A memory device, comprising:
a semiconductor substrate:
an interconnect structure disposed over the semiconductor substrate; and
a memory cell disposed over the interconnect structure and electrically coupled with the semiconductor substrate and the interconnect structure, the memory cell comprising:
  a top electrode:
  a bottom electrode:
  a MTJ structure between the top electrode and the bottom electrode, wherein the bottom electrode comprises an inner portion of a first thickness and an outer portion of a second thickness surrounding the inner portion, the MTJ structure is located on the inner portion of the bottom electrode, and the first thickness is larger than the second thickness; and
  a spacer disposed on sidewalls of the MTJ structure and the top electrode, wherein the spacer falls within a perimeter of a sidewall of the inner portion of the bottom electrode.

8. The memory device of claim 7, further comprising:
a dielectric layer surrounding the memory cell; and
a conductive via through the dielectric layer, wherein the conductive via is in physical contact with the top electrode of the memory cell.

9. The memory device of claim 7, wherein the bottom electrode further comprises a middle portion of a third thickness disposed between the inner portion and the outer portion.

10. The memory device of claim 9, wherein the third thickness is substantially the same as the first thickness.

11. The memory device of claim 9, wherein the third thickness is larger than the second thickness and smaller than the first thickness.

12. The memory device of claim 9, wherein the spacer surrounds the MTJ structure and the top electrode.

13. The memory device of claim 12, wherein the spacer surrounds the top electrode but exposes a top surface of the top electrode.

14. The memory device of claim 7, wherein a material of the bottom electrode includes platinum, palladium, beta-phase tungsten, beta phase tantalum, an alloy of palladium and platinum, an alloy of gold and platinum, bismuth selenide, tungsten ditelluride or combination thereof.

15. A method for forming a memory device, comprising:
providing a semiconductor substrate having transistors formed therein;
forming a spin Hall electrode layer over the semiconductor substrate and electrically coupled to the transistors;
forming an MTJ layer stack over the spin Hall electrode layer;
forming a hard mask layer over the MTJ layer stack;
patterning the MTJ layer stack and the hard mask layer to form an MTJ pillar and a hard mask over the MTJ pillar and define a trench beside the MTJ pillar;
depositing a spacer layer conformally covering the spin Hall electrode layer, the MTJ pillar, the hard mask and the trench;
etching the spacer layer to form a spacer on sidewalls of the MTJ pillar and the hard mask, wherein the MTJ pillar, the hard mask and the spacer together covers a portion of the spin Hall electrode layer; and
forming a recess in the uncovered spin Hall electrode layer beside the spacer by performing a global etching process, so that the spin Hall electrode layer at least comprises an inner portion and an outer portion surrounding the inner portion, and a top surface of the outer portion is lower than a top surface of the inner portion,
wherein a bottom edge of an outer sidewall of the spacer and a sidewall of the inner portion of the spin Hall electrode layer are substantially vertically aligned with each other.

16. The method of claim 15, wherein the global etching process is performed using the MTJ pillar, the hard mask and the spacer as a masking layer.

17. The method of claim 15, wherein during the patterning the MTJ layer stack and the hard mask layer, the hard mask layer and the MTJ layer stack are etched and then a portion of the spin Hall electrode layer is etched to define the trench within the spin Hall electrode layer.

18. The method of claim 17, wherein the spacer is formed directly on the trench and located at a horizontal level lower than that of the MTJ pillar.

19. The method of claim 15, wherein during the patterning the MTJ layer stack and the hard mask layer, the hard mask layer and the MTJ layer stack are etched until the spin Hall electrode layer is exposed without removing the spin Hall electrode layer, and the trench is defined between the MTJ pillar and a remained portion of the MTJ layer stack.

20. The method of claim 19, wherein the spacer is formed directly on the trench and located at a same horizontal level as the MTJ pillar.

* * * * *